United States Patent [19]
Shindo

[11] Patent Number: 5,973,950
[45] Date of Patent: Oct. 26, 1999

[54] HIERARCHY PRIORITY ENCODER FOR AN ASSOCIATIVE MEMORY HAVING AN INTERMEDIATE LEVEL MULTIPLEXER CIRCUIT

[75] Inventor: Takeshi Shindo, Tokyo, Japan

[73] Assignee: NEC Corporation, Tokyo, Japan

[21] Appl. No.: 09/212,955

[22] Filed: Dec. 16, 1998

[51] Int. Cl.$^6$ .................................................. G11C 15/04
[52] U.S. Cl. ...................................... 365/49; 365/230.02
[58] Field of Search ................................. 365/49, 230.02

[56] References Cited

U.S. PATENT DOCUMENTS 5,555,397  9/1996  Sasama et al. ........................... 711/158
5,726,942  3/1998  Yoneda et al. ........................... 365/208

Primary Examiner—Andrew Q. Tran
Attorney, Agent, or Firm—Young & Thompson

[57] ABSTRACT

The present invention provides a priority encoder having at least a unit circuitry of at least three hierarchies. A lowermost level hierarchy has a plurality of lowermost level encoder circuits receiving a plurality of input signals with individually different priorities for encoding the input signals and outputting encoded output signals. The lowermost level encoder circuits are operated to output enable signals which indicate existence of signals to be coded into address signals in the input signals. An intermediate level hierarchy has a plurality of multiplexer circuits connected to the lowermost level encoder circuits for receiving the encoded output signals and the enable signals so that the multiplexer circuits are configuared to output only and encoded signal which has a highest priority in the encoded output signals to be corded into address signals. An uppermost level hierarchy has at least an uppermost level encoder circuit receiving the enable signals from the lowermost level encoder circuits for encoding the enable signals too output encoded enable signals.

3 Claims, 7 Drawing Sheets

HIERARCHY PRIORITY ENCODER FOR AN ASSOCIATIVE MEMORY HAVING AN INTERMEDIATE LEVEL MULTIPLEXER CIRCUIT

BACKGROUND OF THE INVENTION

The present invention relates to a priority encoder and a priority encoding method, and more particularly to a priority encoder capable of encoding input signals into addresses for sequential outputs of the encoded addresses in accordance with predetermined priorities, wherein the priority encoder encodes correspondence signals from memory cells of an associative memory.

It is necessary for the normal memory to designate its address for reading out data from the designated address or writing data into the designated address. By contrast to the normal memory, the associative memory or a content addressable memory has not only the same function of random access memory but also additional functions of providing informations about existences of data identical with or similar to entered retrieval data as well as about other data on one or more words having identical or similar data and those addresses. If a word includes data identical with or similar to entered retrieval data, then it is referred to as the word corresponds to the entered retrieval data. It is possible that a plurality of words corresponds to the entered retrieval data. If the plural word correspond to the entered retrieval data, then the function possessed by the normal encoder is incapable of correct outputs. The content addressable memory is responsible to the case where the plural word correspond to the entered retrieval data. Namely, the content addressable memory has a priority encoder which is capable of encoding correspondence signals for sequential outputs of address signals in accordance with predetermined priorities, wherein the correspondence signal means that a correspondence with the entered retrieval data.

A conventional priority encoder is disclosed in Japanese laid-open patent publication No. 5-189979. This conventional priority encoder will be described with reference to FIG. 1 which is a circuit diagram illustrative of the conventional priority encoder provided in the content addressable memory.

The conventional priority encoder has a hierarchical structure of three hierarchies, for example, the uppermost level, intermediate level and the lowermost level. The lowermost level hierarchy has sixteen first level hierarchy priority circuits 11-0, 11-1, 11-2, - - - 11-15. Each of the sixteen first level hierarchy priority circuits 11-0, 11-1, 11-2, - - - 11-15 is connected to a first level address encoder 14 so that the first level address encoder 14 receives output signals from the first level hierarchy priority circuit for encoding the output signals into address signals of two bits. The intermediate level hierarchy has four second level hierarchy priority circuits 12-0, 12-1, 12-2, and 12-3. Each of the four second level hierarchy priority circuits 12-0, 12-1, 12-2, and 12-3 is connected to a second level address encoder 14 so that tie second level address encoder 14 receives output signals from the second level hierarchy priority circuit for encoding the output signals into address signals of two bits. The uppermost level hierarchy has a single third level hierarchy priority circuit 13. The single third level hierarchy priority circuit 13 is connected to a third level address encoder 14 so that the third level address encoder 14 receives output signals from the third level hierarchy priority circuit for encoding the output signals into address signals of two bits.

Each of the sixteen first level hierarchy priority circuits 11-0, 11-1, 11-2, - - - 11-15 and the four second level hierarchy priority circuits 12-0, 12-1, 12-2, and 12-3 has a single OR-output terminal "OR" from which OR-output signal is outputted. Each of the sixteen first level hierarchy priority circuits 11-0, 11-1, 11-2, - - - 11-15 and the four second level hierarchy priority circuits 12-0, 12-1, 12-2, and 12-3 as well as the single third level hierarchy priority circuit 13 has four input terminals. The four input terminals of the second level hierarchy priority circuit 12-0 are connected to the OR-output terminals "OR" of the four first level hierarchy priority circuits 11-0, 11 -2 and 11-3 respectively The four input terminals of the second level hierarchy priority circuit 12-1 are connected to the OR-output terminals "OR" of the four first level hierarchy priority circuits 11-4, 11-5, 11-6 and 11-7 respectively. The four input terminals of the second level hierarchy priority circuit 12-2 are connected to the OR-output terminals "OR" of the four first level hierarchy priority circuits 11-8, 11-9, 11-10 and 11-11 respectively. The four input terminals of the second level hierarchy priority circuit 12-3 are connected to the OR-output terminals "OR" of the four first level hierarchy priority circuits 11-12, 11-13, 11-14 and 11-15 respectively. The four input terminals of the third level hierarchy priority circuit 13 are connected to the OR-output terminals "OR" of the four second level hierarchy priority circuits 12-0, 12-1, 12-2 and 12-3 respectively. The four input terminals of each of the first level hierarchy priority circuits 11-0, 11-1, 11-2, - - - 11-15 receive correspondence signals in binary digits, wherein high level "1" means the correspondence with the entered retrieval signal, whilst the low level "0" means no correspondence with the entered retrieval signal. The OR-output signal becomes high level "1" when at least any one of the input signals as the correspondence signals is high level "1". Otherwise, the OR-output signal becomes low level "0".

Each of the sixteen first level hierarchy priority circuits 11-0, 11-1, 11-2, - - - 11-15 and the four second level hierarchy priority circuits 12-0, 12-1, 12-2, and 12-3 also has a single enable input terminal "EN". The enable input terminal "EN" is provided in a first side of the priority circuit, whilst the OR-output terminal "OR" is provided in a second side of the priority circuit, wherein the first side corresponds to the upper side whilst the second side corresponds to the lower side. In the four input terminals of the individual priority circuit, the nearest terminal to the upper side of the individual priority circuit is the uppermost input terminal. In the four input terminals of the individual priority circuit, the second nearest terminal to the upper side of the individual priority circuit is the upper input terminal. In the four input terminals of the individual priority circuit, the second nearest terminal to the lower side of the individual priority circuit is the lower input terminal. In the four input terminals of the individual priority circuit, the nearest terminal to the lower side of the individual priority circuit is the lowermost input terminal. The individual priority circuit also has four output terminals. In the four input terminals of the individual priority circuit, the nearest terminal to the upper side of the individual priority circuit is the uppermost output terminal In the four input terminals of the individual priority circuit, the second nearest terminal to the upper side of the individual priority circuit is the upper output terminal. In the four input terminals of the individual priority circuit, the second nearest terminal to the lower side of the individual priority circuit is the lower output terminal. In the four input terminals of the individual priority circuit, the nearest terminal to the lower side of the individual priority circuit is the lowermost output terminal. An uppermost output signal from the uppermost output terminal is the first appearance. An upper output signal from the upper output terminal is the second appearance. A lower output signal from the lower output terminal is the third appearance. A lowermost output signal from the lowermost output terminal is the fourth appearance. Namely, in the individual priority circuit, the four output signals are outputted in the order of uppermost to lowermost output signals.

Namely, the lowermost level hierarchy has the first level hierarchy uppermost priority circuit 11-0, the first level hierarchy second upper priority circuit 11-1, the first level hierarchy third upper priority circuit 11-2, the first level hierarchy fourth upper priority circuit 11-3, the first level hierarchy fifth upper priority circuit 11-4, the first level hierarchy sixth upper priority circuit 11-5, the first level hierarchy seventh upper priority circuit 11-6, the first level hierarchy eighth upper priority circuit 11-7, the first level hierarchy eighth lower priority circuit 11-8, the first level hierarchy seventh lower priority circuit 11-9, the first level hierarchy sixth lower priority circuit 11-10, the first level hierarchy fifth lower priority circuit 11—11, the first level hierarchy fourth lower priority circuit 11-12, the first level hierarchy third lower priority circuit 11-13, the first level hierarchy second lower priority circuit 11-14, and the first level hierarchy lowermost priority circuit 11-15.

Namely, the intermediate level hierarchy has the second level hierarchy uppermost priority circuit 12-0, the second level hierarchy second upper priority circuit 12-1, the second level hierarchy second lower priority circuit 12-2, and the second level hierarchy lowermost priority circuit 12-3. The lowermost level hierarchy has the single third level hierarchy priority circuit 13.

The uppermost output terminal of the second level hierarchy uppermost priority circuit 12-0 is connected to the enable input terminal "EN" of the first level hierarchy uppermost priority circuit 11-0, so that the output signal is fed back to the enable input terminal "EN". The upper output terminal of the second level hierarchy uppermost priority circuit 12-0 is connected to the enable input terminal "EN" of the first level hierarchy second upper priority circuit 11-1, so that the output signal is fed back to the enable input terminal "EN". The lower output terminal of the second level hierarchy uppermost priority circuit 12-0 is connected to the enable input terminal "EN" of the first level hierarchy third upper priority circuit 11-2, so that the output signal is fed back to the enable input terminal "EN". The lowermost output terminal of the second level hierarchy uppermost priority circuit 12-0 is connected to the enable input terminal "EN" of the first level hierarchy fourth upper priority circuit 11-3, so that the output signal is fed back to the enable input terminal "EN".

The uppermost output terminal of the second level hierarchy second upper priority circuit 12-1 is connected to the enable input terminal "EN" of the first level hierarchy fifth upper priority circuit 11-4, so that the output signal is fed back to the enable input terminal "EN". The upper output terminal of the second level hierarchy second upper priority circuit 12-1 is connected to the enable input terminal "EN" of the first level hierarchy sixth upper priority circuit 11-5, so that the output signal is fed back to the enable input terminal "EN". The lower output terminal of the second level hierarchy second upper priority circuit 12-1 is connected to the enable input terminal "EN" of the first level hierarchy seventh upper priority circuit 11-6, so that the output signal is fed back to the enable input terminal "EN". The lowermost output terminal of the second level hierarchy second upper priority circuit 12-1 is connected to the enable input terminal "EN" of the first level hierarchy eighth upper priority circuit 11-7, so that the output signal is fed back to the enable input terminal "EN".

The uppermost output terminal of the second level hierarchy second lower priority circuit 12-2 is connected to the enable input terminal "EN" of the first level hierarchy eighth lower priority circuit 11-8, so that the output signal is fed back to the enable input terminal "EN". The upper output terminal of the second level hierarchy second lower priority circuit 12-2 is connected to the enable input terminal "EN" of the first level hierarchy seventh lower priority circuit 11-9, so that the output signal is fed back to the enable input terminal "EN". The lower output terminal of the second level hierarchy second lower priority circuit 12-2 is connected to the enable input terminal "EN" of the first level hierarchy sixth lower priority circuit 11-10, so that the output signal is fed back to the enable input terminal "EN". The lowermost output terminal of the second level hierarchy second lower priority circuit 12-2 is connected to the enable input terminal "EN" of the first level hierarchy fifth lower priority circuit 11—11, so that the output signal is fed back to the enable input terminal "EN".

The uppermost output terminal of the second level hierarchy lowermost priority circuit 12-3 is connected to the enable input terminal "EN" of the first level hierarchy fourth lower priority circuit 11-12, so that the output signal is fed back to the enable input terminal "EN". The upper output terminal of the second level hierarchy lowermost priority circuit 12-3 is connected to the enable input terminal "EN" of the first level hierarchy third lower priority circuit 11-13, so that the output signal is fed back to the enable input terminal "EN". The lower output terminal of the second level hierarchy lowermost priority circuit 12-3 is connected to the enable input terminal "EN" of the first level hierarchy second lower priority circuit 11-14, so that the output signal is fed back to the enable input terminal "EN". The lowermost output terminal of the second level hierarchy lowermost priority circuit 12-3 is connected to the enable input terminal "EN" of the first level hierarchy lowermost priority circuit 11-15, so that the output signal is fed back to the enable input terminal "EN".

The uppermost output terminal of the third level hierarchy priority circuit 13 is connected to the enable input terminal "EN" of the second level hierarchy uppermost priority circuit 12-0, so that the output signal is fed back to the enable input terminal "EN". The upper output terminal of the third level hierarchy priority circuit 13 is connected to the enable input terminal "EN" of the second level hierarchy second upper priority circuit 12-1, so that the output signal is fed back to the enable input terminal "EN". The lower output terminal of the third level hierarchy priority circuit 13 is connected to the enable input terminal "EN" of the second level hierarchy second lower priority circuit 12-2, so that the output signal is fed back to the enable input terminal "EN". The lowermost output terminal of the third level hierarchy priority circuit 13 is connected to the enable input terminal "EN" of the second level hierarchy lowermost priority circuit 12-3, so that the output signal is fed back to the enable input terminal "EN".

As described above, the conventional priority encoder circuit of FIG. 1 has the sixteen lowermost level hierarchy priority circuits 11-0 to 11-15, each having the four input terminals, so that the conventional priority encoder circuit of FIG. 1 has 64 input terminals for receiving 64 input signals. Namely, the conventional priority encoder circuit of FIG. 1 encodes 64 input signals to output encoded address signals of 6-bits (A0, A1, A2, A3, A4 and A5).

All of the address encoders 14 has the same circuit configuration which has a set of four MOS field effect transistors 15. Gates of two of the MOS field effect transistors 15 are connected to the uppermost output terminal of the individual priority circuit. A gate of the other MOS filed effect transistor 15 is connected to the upper output terminal of the individual priority circuit. A gate of the remaining MOS filed effect transistor 15 is connected to the lower output terminal of the individual priority circuit. The lowermost output terminal of the individual priority circuit is not connected to the address encoder. The individual MOS filed effect transistors 15 perform ON/OFF operations in accordance with the output signal from the address encoder. As described above, the address signals encoded by the priority encoder are 6-bits (A0, A1, A2, A3, A4 and A5). The sixteen address encoders 14 connected to the output terminals of the sixteen lowermost level hierarchy priority circuits 11-0 to 11-15 are operated to decide the lowermost bit A0 and the second lower bit A1 of the 6-bits address signals. The four address encoders 14 connected to the output terminals of the four intermediate level hierarchy priority circuits 12-0 to 12-3 are operated to decide the third lower bit A2 and the third upper bit A3 of the 6-bits address signals. The single address encoder 14 connected to the output terminals of the single uppermost level hierarchy priority circuit 13 is operated to decide the second upper bit A4 and the uppermost bit A5 of the 6-bits address signals.

Each of the sixteen uppermost level hierarchy priority circuits 11-0, 11-1, 11-2, - - - 11-15 and the four intermediate level hierarchy priority circuits 12-0, 12-1, 12-2, and 12-3 as well as the lowermost level hierarchy priority circuit 13 is operated to output the high level output signal "1" from the uppermost output terminal only.

As described above, output signals from the uppermost level hierarchy priority circuit 13 are fed back to the enable input signal terminals of the four intermediate level hierarchy priority circuits 12-0, 12-1, 12-2, and 12-3 and also output signals from the four intermediate level hierarchy priority circuits 12-0, 12-1, 12-2, and 12-3 are also fed back to the enable input signal terminals of the sixteen uppermost level hierarchy priority circuits 11-0, 11-1, 1-12, - - - 11-15, so that of all of the input signals inputted into the sixteen uppermost level hierarchy priority circuits 11-0, 11-1, 11-2, - - - 11-15 are low level "0" indicating no correspondence with the entered retrieval signal, then the output signals from the sixteen uppermost level hierarchy priority circuits 11-0, 11-1, 11-2, - - - 11-15 are made invalid and further the output signals from the four intermediate level hierarchy priority circuits 12-0, 12-1, 12-2, and 12-3 are also made invalid. If a plurality of the correspondence signals "1" are inputted into the priority encoder, then encoded address signals of 6-bits are sequentially outputted into the terminals A0, A1, A2, A3, A4, and A5 in the order of the priorities possessed by the correspondence signal "1" inputted into the priority encoder. For example, an encoded address signal of 6-bits from the correspondence signal "1" having the highest priority is first outputted into the terminals A5, A4, A3, A2, A1, and A0.

As the capacity of the advanced content addressable memory has been on the increase, the number of inputs into the priority encoder has also been on the increase.

The conventional priority encoder has been designed to have the hierarchical structure for realizing high speed performance. This hierarchical structure requires that the outputs of the lower level priority circuit are fed back to the enalle input terminal of the upper level priority circuit, for which reason it takes a long time to output the encoded result.

In the above circumstances, it had been required to develop a novel priority encoder free from the above problems.

SUMMARY OF THE INVENTION

Accordingly, it is an object of the present invention to provide a novel priority encoder free from the above problems.

It is a further object of the present invention to provide a novel priority encoder exhibiting high speed performances.

It is a still further object of the present invention to provide a novel priority encoder suitable for a contact addressable memory of a large memory capacity.

The present invention provides a priority encoder having at least a unit circuitry of at least three hierarchies. A lowermost level hierarchy has a plurality of lowermost level encoder circuits receiving a plurality of input signals with individually different priorities for encoding the input signals and outputting encoded output signals. The lowermost level encoder circuits are operated to output enable signals which indicate existence of signals to be coded into address signals in the input signals. An intermediate level hierarchy has a plurality of multiplexer circuits connected to the lowermost level encoder circuits for receiving the encoded output signals and the enable; signals so that the multiplexer circuits are configuared to output only an encoded signal which has a highest priority in the encoded output signals to be corded into address signals. An uppermost level hierarchy has at least an uppermost level encoder circuit receiving the enable signals from the lowermost level encoder circuits for encoding the enable signals to output encoded enable signals.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
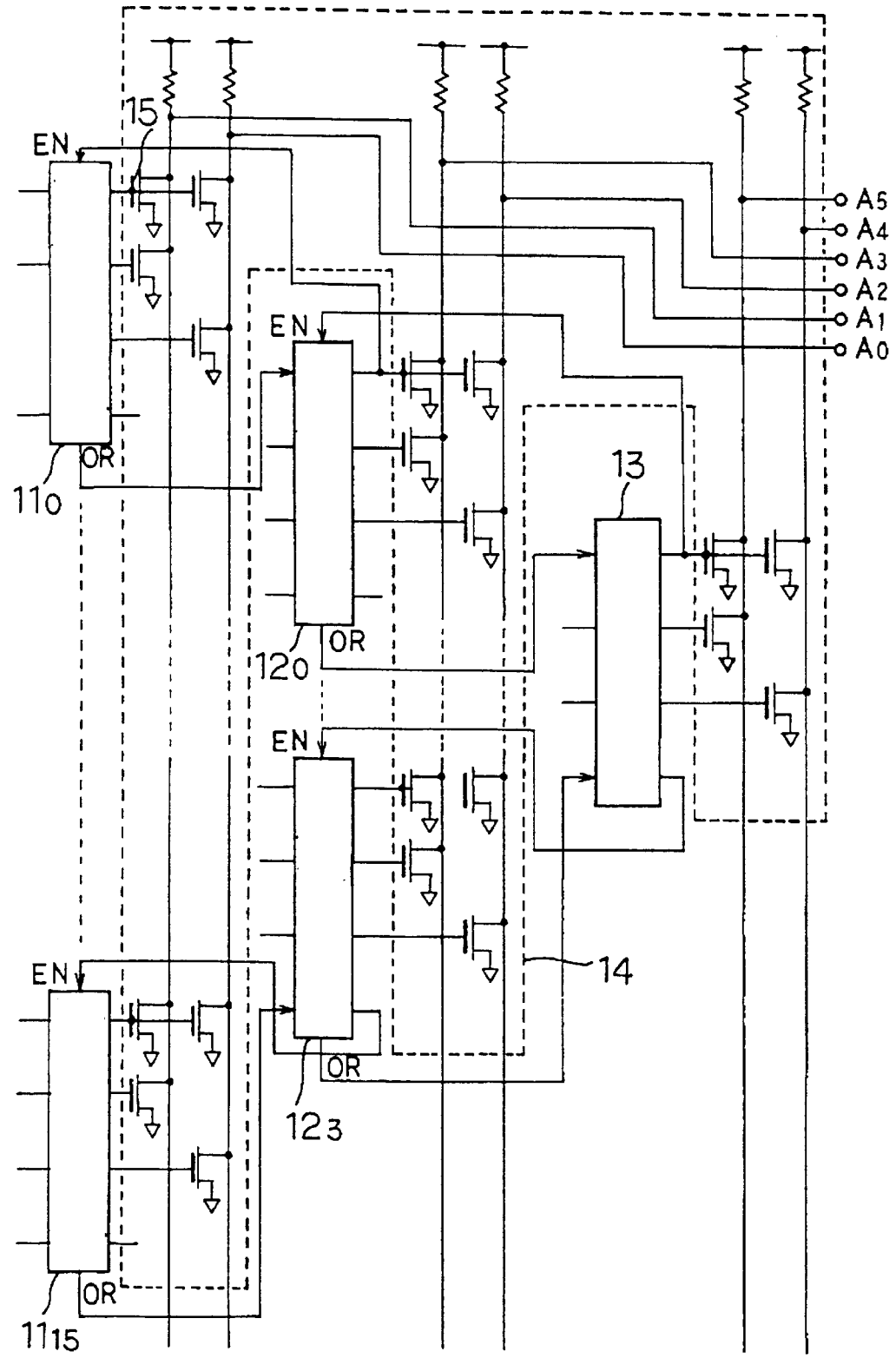
FIG. 1 is a circuit diagram illustrative of the conventional priority encoder provided in the content addressable memory.

The present invention provides a priority encoder having at least a unit circuitry of at least three hierarchies. A lowermost level hierarchy has a plurality of lowermost level encoder circuits receiving a plurality of input signals with individually different priorities for encoding the input signals and outputting encoded output signals. The lowermost level encoder circuits are operated to output enable signals which indicate existence of signals to be coded into address signals in the input signals. An intermediate level hierarchy has a plurality of multiplexer circuits connected to the lowermost level encoder circuits for receiving the encoded output signals and the enable signals so that the multiplexer circuits are configured to output only an encoded signal which has a highest priority in the encoded output signals to be corded into address signals. An uppermost level hierarchy has at least an uppermost level encoder circuit receiving the enable signals from the lowermost level encoder circuits for encoding the enable signals to output encoded enable signals.

It is possible that the priority encoder has a single set of the unit circuitry, so that an uppermost one of the multiplexer circuits in the intermediate level hierarchy outputs a lowermost bit part of the output signals of the priority encoder and that the uppermost level encoder circuit in the uppermost level hierarchy outputs an uppermost bit part of the output signals of the priority encoder.

It is also possible that the priority encoder has plural sets of the unit circuitry and a plurality of stages, each having an extension circuit which comprises the following elements. At least a first extension multiplexer is provided for receiving both the encoded signal from the multiplexer circuits in the intermediate level hierarchy and output signals from a first extension multiplexer on a previous stage as well as receiving an enable signal from the uppermost level encoder circuit so that the first extension multiplexer outputs a lowermost bit part of the output signals of the priority encoder. At least a second extension multiplexer is provided for receiving both the encoded enable signals from the uppermost level encoder circuit in the uppermost level hierarchy and output signals from a second extension multiplexer on the previous stage as well as receiving the enable signal from the uppermost level encoder circuit so that the second extension multiplexer outputs an intermediate bit part of the output signals of the priority encoder. At least an extension encoder is provided for receiving the enable signal from the uppermost level encoder circuit so that the extension encoder outputs an uppermost bit part of the output signals of the priority encoder.

PREFERRED EMBODIMENTS
FIRST EMBODIMENT

A first embodiment according to the present invention will be described in detail with reference to FIG. 2 which is a block diagram illustrative of a first novel priority encoder in a first embodiment in accordance with the present: invention, wherein the priority encoder receives sixteen input signals for encoding the same to generate a 4-bits encoded output signal.

The priority encoder has three hierarchies, for example, a lowermost level hierarchy, an intermediate level hierarchy, and an uppermost level hierarchy. The lowermost level hierarchy has four lowermost level hierarchy encoder circuits 10, 11, 12 and 13. The intermediate level hierarchy has three intermediate level hierarchy multiplexers 20, 21 and 22. The uppermost level hierarchy has a single uppermost level hierarchy encoder circuit 3. The four lowermost level hierarchy encoder circuits 10, 11, 12 and 13 have the same circuit configuration as each other and further the uppermost level hierarchy encoder circuit 3 has the said circuit configuration as the four lowermost level hierarchy encoder circuits 10, 11, 12 and 13. Each of the four lowermost level hierarchy encoder circuits 10, 11, 12 and 13 and the uppermost level hierarchy encoder circuit 3 has fourth input terminals A, B, C and D for receiving four input signals and two output terminals Y1 and Y2 from which 2-bits of an encoded output signal are outputted as well as an enable signal output terminal "EN" from which an enable output signal as the logical sum of the 2-bits of the encoded output signal is outputted.

The first lowermost level hierarchy encoder circuit 13 has the uppermost level in the lowermost level hierarchy. The second lowermost level hierarchy encoder circuit 12 has the second upper level in the lowermost level hierarchy. The third lowermost level hierarchy encoder circuit 11 has the second lower level in the lowermost level hierarchy. The fourth lowermost level hierarchy encoder circuit 10 has the lowermost level in the lowermost level hierarchy.

The first lowermost level hierarchy encoder circuit 13 has an uppermost input terminal D for receiving an uppermost input signal ML0, a second upper input terminal C for receiving a second upper input signal ML1, a second lower input terminal B for receiving a third upper input signal ML2, and a lowermost input terminal A for receiving a fourth upper input signal ML3. The first lowermost level hierarchy encoder circuit 13 receives the four input signals, for example, the uppermost input signal ML0, the second upper input signal ML1, the third upper input signal ML2 and the fourth upper input signal ML3 for encoding the four input signals to output a 2-bits encoded output signal on the two output terminals Y1 and Y2 and further output a logical sum OR of 2-bits of the encoded output signal as an enabling output signal on the enabling output terminal "EN". The 2-bits encoded output signal indicates the input terminal A, B, C or D having received the correspondence signal "1" with the retrieval signal entered. If at least any one of the four input signals is the high level "1" indicating the correspondence with the retrieval signal entered, then the enabling output signal of the high level "1" is outputted onto the enabling output terminal "EN". If no correspondence signals are inputted into the four input terminals or the all of the four input signals are low level "0", then the enabling output signal of low level "0" is outputted on the enabling output terminal "EN".

The second lowermost level hierarchy encoder circuit 12 has an uppermost input terminal D for receiving a fifth upper input signal ML4, a second upper input terminal C for receiving a sixth upper input signal ML5, a second lower input terminal B for receiving a seventh upper input signal ML6, and a lowermost input terminal A for receiving an eighth upper input signal ML7. The second lowermost level hierarchy encoder circuit 12 receives the four input signals, for example, the fifth upper input signal ML4, the sixth upper input signal ML5, the seventh upper input signal ML6 and the eighth upper input signal ML7 for encoding the four input signals to output a 2-bits encoded output signal on the two output terminals Y1 and Y2 and further output a logical sum OR of 2-bits of the encoded output signal as an enabling output signal on the enabling output terminal "EN". The 2-bits encoded output signal indicates the input terminal A, B, C or D having received the correspondence signal "1" with the retrieval signal entered. If at least any one of the four input signals is the high level "1" indicating the correspondence with the retrieval signal entered, then the enabling output signal of the high level "1" is outputted onto the enabling output terminal "EN". If no correspondence signals are inputted into the four input terminals or the all of the four input signals are low level "0", then the enabling output signal of low level "0" is outputted on the enabling output terminal "EN".

The third lowermost level hierarchy encoder circuit 11 has an uppermost input terminal D for receiving an eighth lower input signal ML8, a second upper input terminal C for receiving a seventh lower input signal ML9, a second lower input terminal B for receiving a sixth lower input signal MLA, and a lowermost input terminal A for receiving a fifth lower input signal MLB. The third lowermost level hierarchy encoder circuit 11 receives the four input signals, for example, the eighth lower input signal ML8, the seventh lower input signal ML9, the sixth lower input signal MLA and the fifth lower input signal MLB for encoding the four input signals to output a 2-bits encoded output signal on the two output terminals Y1 and Y2 and further output a logical sum OR of 2-bits of the encoded output signal as an enabling output signal on the enabling output terminal "EN". The 2-bits encoded output signal indicates the input terminal A, B, C or D having received the correspondence signal "1" with the retrieval signal entered. If at least any one of the four input signals is the high level "1" indicating the correspondence with the retrieval signal entered, then the enabling output signal of the high level "1" is outputted onto the enabling output terminal "EN". If no correspondence signals are inputted into the four input terminals or the all of the four input signals are low level "0", then the enabling output signal of low level "0" is outputted on the enabling output terminal "EN".

The fourth lowermost level hierarchy encoder circuit 10 has an uppermost input terminal D for receiving a fourth lower input signal MLC, a second upper input terminal C for receiving a third lower input signal MLD, a second lower input terminal B for receiving a second lower input signal MLE, and a lowermost input terminal A for receiving a lowermost input signal MLF. The fourth lowermost level hierarchy encoder circuit 10 receives the four input signals, for example, the fourth lower input signal MLC, the third lower input signal MLD, the second lower input signal MLE and the lowermost input signal MLF for encoding the four input signals to output a 2-bits encoded output signal on the two output terminals Y1 and Y2 and further output a logical sum OR of 2-bits of the encoded output signal as an enabling output signal on the enabling output terminal "EN". The 2-bits encoded output signal indicates the input terminal A, B, C or D having received the correspondence signal "1" with the retrieval signal entered. If at least any one of the four input signals is the high level "1" indicating the correspondence with the retrieval signal entered, then the enabling output signal of the high level "1" is outputted onto the enabling output terminal "EN". If no correspondence signals are inputted into the four input terminals or the all of the four input signals are low level "0", then the enabling output signal of low level "0" is outputted on the enabling output terminal "EN".

As a modification, the input signal MLF is the uppermost input signal whilst the input signal ML0 is the lowermost input signal.

The intermediate level hierarchy has the three intermediate level hierarchy multiplexers 20, 21 and 22. The three intermediate level hierarchy multiplexers 20, 21 and 22 have the same circuit configuration as each other. Each of the three intermediate level hierarchy multiplexers 20, 21 and 22 has four input terminals A0, B0, A1 and B1, a single control terminal C and two output terminals Y0 and Y1 for multiplexing the 4-bits input signal into a 2-bits multiplexed output signal. The first intermediate level hierarchy multiplexer 22 has the uppermost level in the intermediate level hierarchy. The second intermediate level hierarchy multiplexer 21 has the intermediate level in the intermediate level hierarchy. The third intermediate level hierarchy multiplexer 20 has the lowermost level in the intermediate level hierarchy.

The first intermediate level hierarchy multiplexer 22 has a first input terminal A0 which is connected to the output terminal Y0 of the first lowermost level hierarchy encoder circuit 13 for receiving one of the 2-bits encoded output signal from the first lowermost level hierarchy encoder circuit 13. The first intermediate level hierarchy multiplexer 22 also has a second input terminal B0 which is connected to the output terminal Y0 of the second intermediate level hierarchy multiplexer 21 for receiving one of the 2-bits multiplexed output signal from the second intermediate level hierarchy multiplexer 21. The first intermediate level hierarchy multiplexer 22 also has a third input terminal A1 which is connected to the output terminal Y1 of the first lowermost level hierarchy encoder circuit 13 for receiving another of the 2-bits encoded output signal from the first lowermost level hierarchy encoder circuit 13. The first intermediate level hierarchy multiplexer 22 also has a fourth input terminal B1 which is connected to the output terminal Y1 of the second intermediate level hierarchy multiplexer 21 for receiving another of the 2-bits multiplexed output signal from the second intermediate level hierarchy multiplexer 21. The first intermediate level hierarchy multiplexer 22 also has the control terminal connected to the enable output terminal "EN" of the first lowermost level hierarchy encoder circuit 13. If the control terminal C of the first intermediate level hierarchy multiplexer 22 receives the enabling signal of the high level "1" indicating at least any one high level "1" of the input signals ML0, ML1, ML2 and ML3, then the first intermediate level hierarchy multiplexer 22 is operated to output, onto the output terminals Y0 and Y1, the 2-bits encoded output signal transmitted from the output terminals of the first lowermost level hierarchy encoder circuit 13 and received by the first and third input terminals A0 and A1. If the control terminal C of the first intermediate level hierarchy multiplexer 22 receives the enabling signal of the low level "0" indicating all low level "0" of the input signals ML0, ML1, ML2 and ML3, then the first intermediate level hierarchy multiplexer 22 is operated to output, onto the output terminals Y0 and Y1, the 2-bits multiplexed output signal transmitted from the output terminals of the second intermediate level hierarchy multiplexer 21 and received by the second and fourth input terminals B0 and B1. The 2-bits output signal on the output terminals Y0 and Y1 of the first intermediate level hierarchy multiplexer 22 act as lower level 2-bits of the 4-bits output signals of the priority encoder.

The second intermediate level hierarchy multiplexer 21 has a first input terminal A0 which is connected to the output terminal Y0 of the second lowermost level hierarchy encoder circuit 12 for receiving one of the 2-bits encoded output signal from the second lowermost level hierarchy encoder circuit 12. The second intermediate level hierarchy multiplexer 21 also has a second input terminal B0 which is connected to the output terminal Y0 of the third intermediate level hierarchy multiplexer 20 for receiving one of the 2-bits multiplexed output signal from the third intermediate level hierarchy multiplexer 20. The second intermediate level hierarchy multiplexer 21 also has a third input terminal A1 which is connected to the output terminal Y1 of the second lowermost level hierarchy encoder circuit 12 for receiving another of the 2-bits encoded output signal from the second lowermost level hierarchy encoder circuit 12. The second intermediate level hierarchy multiplexer 21 also has a fourth input terminal B1 which is corrected to the output terminal Y1 of the third intermediate level hierarchy multiplexer 20 for receiving another of the 2-bits multiplexed output signal from the third intermediate level hierarchy multiplexer 20. The second intermediate level hierarchy multiplexer 21 also has the control terminal connected to the enable output terminal "EN" of the second lowermost level hierarchy encoder circuit 12. If the control terminal C of the second intermediate level hierarchy multiplexer 21 receives the enabling signal of the high level "1" indicating at least any one high level "1" of the input signals ML4, ML5, ML6 and ML7, then the second intermediate level hierarchy multiplexer 21 is operated to output, onto the output terminals Y0 and Y1, the 2-bits encoded output signal transmitted from the output terminals of the second lowermost level hierarchy encoder circuit 12 and received by the first and third input terminals A0 and A1. If the control terminal C of the second intermediate level hierarchy multiplexer 21 receives the enabling signal of the low level "0" indicating all low level "0" of the input signals ML4, ML5, ML6 and ML7, then the second intermediate level hierarchy multiplexer 21 is operated to output, onto the output terminals Y0 and Y1, the 2-bits multiplexed output signal transmitted from the output terminals of the third intermediate level hierarchy multiplexer 20 and received by the second and fourth input terminals B0 and, B1. The 2-bits output signal on the output terminals Y0 and Y1 of the second intermediate level hierarchy multiplexer 21 are transmitted into the second and fourth output terminals of the first intermediate level hierarchy multiplexer 22.

The third intermediate level hierarchy multiplexer 20 has a first input terminal A0 which is connected to the output terminal Y0 of the third lowermost level hierarchy encoder circuit 11 for receiving one of the 2-bits encoded output signal from the third lowermost level hierarchy encoder circuit 11. The third intermediate level hierarchy multiplexer 20 also has a second input terminal B0 which is connected to the output terminal Y0 of the fourth lowermost level hierarchy encoder circuit 10 for receiving one of the 2-bits multiplexed output signal from the fourth lowermost level hierarchy encoder circuit 12. The third intermediate level hierarchy multiplexer 20 also has a third input terminal A1 which is connected to the output terminal Y1 of the third lowermost level hierarchy encoder circuit 11 for receiving another of the 2-bits encoded output signal from the third lowermost level hierarchy encoder circuit 11. The third intermediate level hierarchy multiplexer 20 also has a fourth input terminal B1 which is connected to the output terminal Y1 of the fourth lowermost level hierarchy encoder circuit 10 for receiving another of the 2-bits multiplexed output signal from the fourth lowermost level hierarchy encoder circuit 10. The third intermediate level hierarchy multiplexer 20 also has the control terminal connected to the enable output terminal "EN" of the third lowermost level hierarchy encoder circuit 11. If the control terminal C of the third intermediate level hierarchy multiplexer 20 receives the enabling signal of the high level "1" indicating at least any one high level "1" of the input signals ML8, ML9, MLA and MLB, then the third intermediate level hierarchy multiplexer 20 is operated to output, onto the output terminals Y0 and Y1, the 2-bits encoded output signal transmitted from the output terminals of the third lowermost level hierarchy encoder circuit 11 and received by the first and third input terminals A0 and A1. If the control terminal C of the third intermediate level hierarchy multiplexer 20 receives the enabling signal of the lore level "0" indicating all low level "0" of the input signals ML8, ML9, MLA and MLB, then the third intermediate level hierarchy multiplexer 20 is operated to output, onto the output terminals Y0 and Y1, the 2-bits encoded output signal transmitted from the output terminals of the fourth lowermost level hierarchy encoder circuit 10 and received by the second and fourth input terminals B0 and B1. The 2-bits output signal on the output terminals Y0 and Y1 of the third intermediate level hierarchy multiplexer 20 are transmitted into the second and fourth output terminals of the second intermediate level hierarchy multiplexer 21.

The uppermost level hierarchy encoder circuit 3 has an uppermost input terminal D which is connected to the enabling signal terminal "EN" of the first lowermost level hierarchy encoder circuit 13 having the uppermost level in the lowermost level hierarchy for receiving the enabling output signal from the first lowermost level hierarchy encoder circuit 13. The uppermost level hierarchy encoder circuit 3 also has a second upper input terminal C which is connected to the enabling signal terminal "EN" of the second lowermost level hierarchy encoder circuit 12 having the second upper level in the lowermost level hierarchy for receiving the enabling output signal from the second lowermost level hierarchy encoder circuit 12. The uppermost level hierarchy encoder circuit 3 also has a second lower input terminal B which is connected to the enabling signal terminal "EN" of the third lowermost level hierarchy encoder circuit 11 having the second lower level in the lowermost level hierarchy for receiving the enabling output signal from the third lowermost level hierarchy encoder circuit 11. The uppermost level hierarchy encoder circuit 3 also has a lowermost input terminal A which is connected to the enabling signal terminal "EN" of the fourth lowermost level hierarchy encoder circuit 10 having the lowermost level in the lowermost level hierarchy for receiving the enabling output signal from the fourth lowermost level hierarchy encoder circuit 10. The uppermost level hierarchy encoder circuit 3 receives the four enabling output signals for encoding the four input signals to output a 2-bits encoded output signal on the two output terminals Y1 and Y2 and further output a logical sum OR of 2-bits of the encoded output signal as an enabling output signal on the enabling output terminal "EN". The 2-bits encoded output signal indicates the input terminal A, B, C or D having received the correspondence signal "1" with the retrieval signal entered, The 2-bits encoded output signal on the output terminals Y0 and Y1 act as the upper level 2-bits of the 4-bits output signals of the priority encoder. If at least any one of the four input signals is the high level "1", then the enabling output signal of the high level "1" is outputted onto the enabling output terminal "EN". If all of the four input signals are low level "0", then the enabling output signal of low level "0" is outputted on the enabling output terminal "EN".

Figure 4:
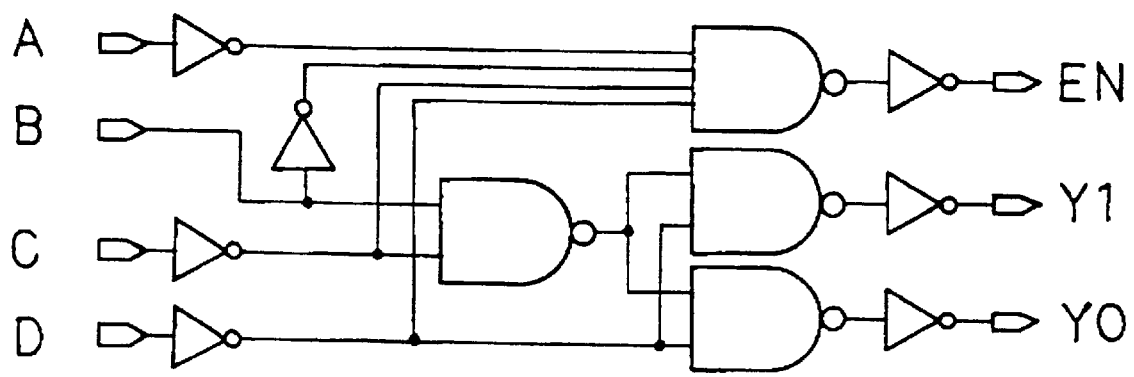
FIG. 4 is a circuit diagram illustrative of one example of the encoder circuit available in the novel priority encoder, wherein the encoder circuit comprises logic gates in accordance with the present invention.
Figure 5:
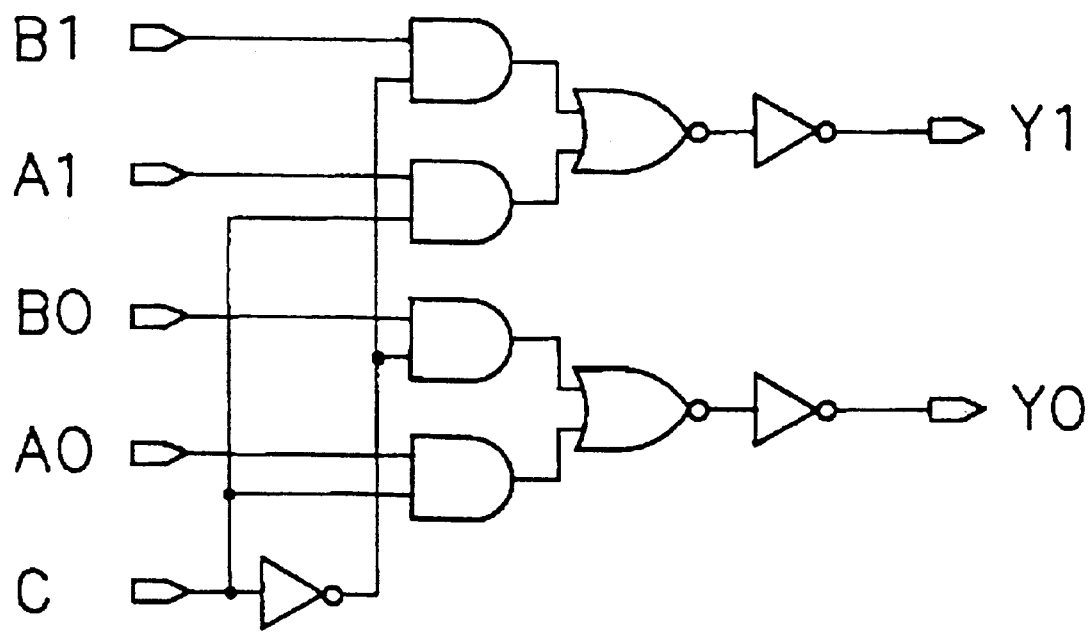
FIG. 5 is a circuit diagram illustrative of one example of the multiplexer circuit available in the novel priority encoder, wherein the multiplexer circuit comprises logic gates in accordance with the present invention.
Figure 6:
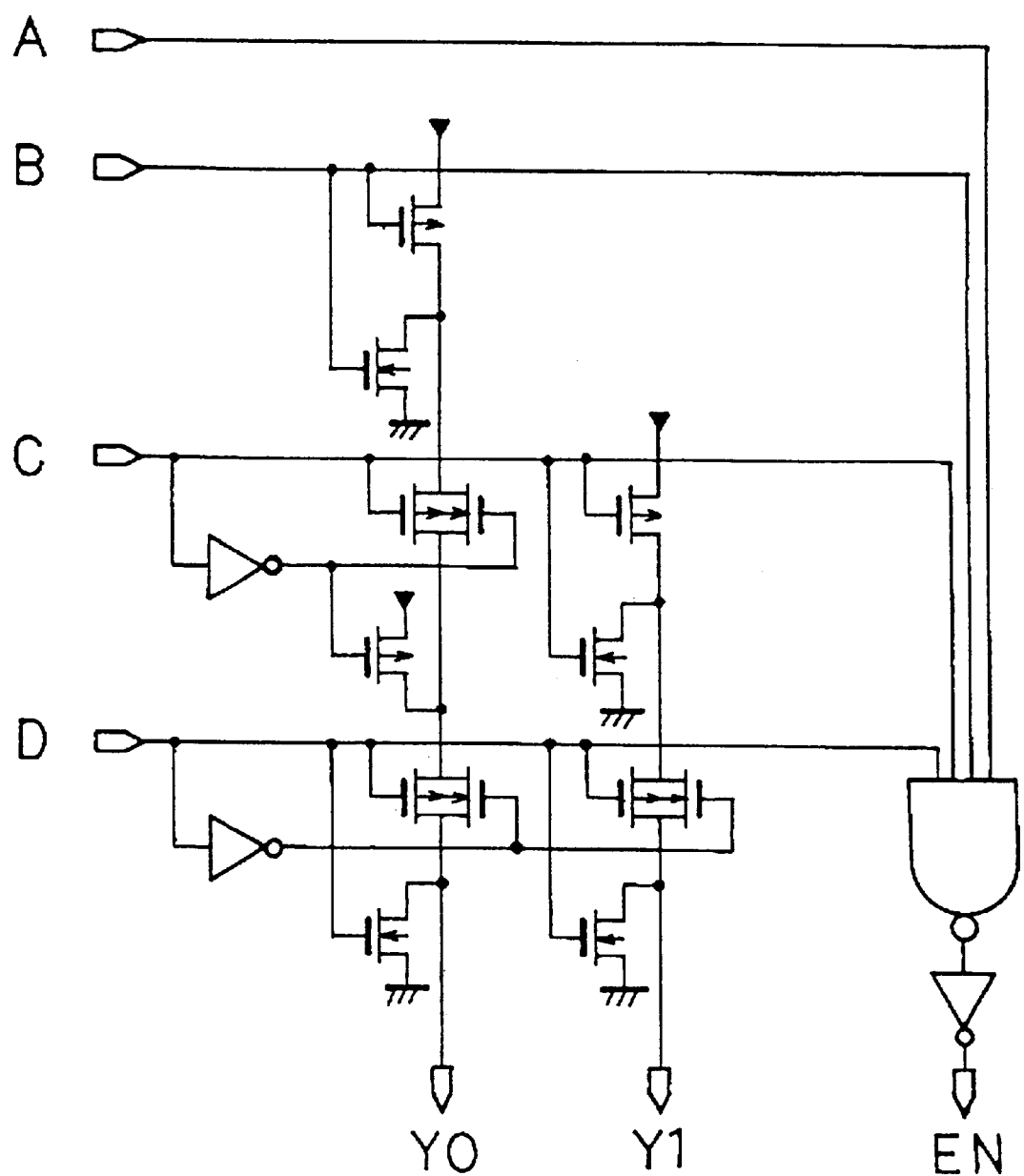
FIG. 6 is a circuit diagram illustrative of other example of the encoder circuit available in the novel priority encoder, wherein the encoder circuit comprises logic gates in combination with switches of MOS field effect transistors to reduce the number of the logic gates for further reduction in time deal of the priority encoder in accordance with the present invention.
Figure 7:
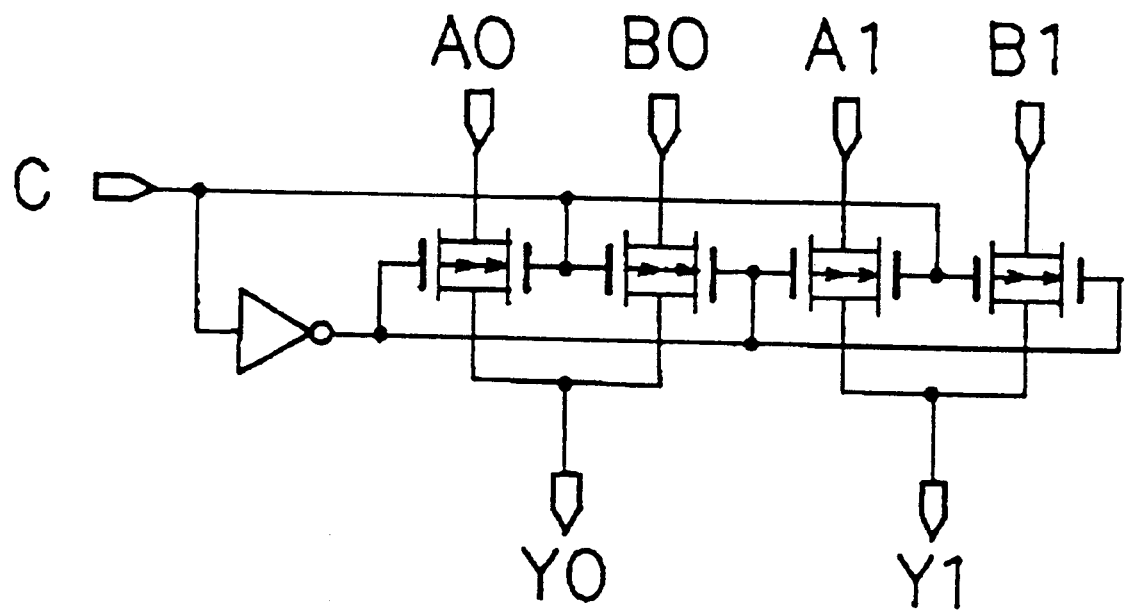
FIG. 7 is a circuit diagram illustrative of other example of the multiplexer circuit available in the novel priority encoder, wherein the multiplexer circuit comprises logic gates in combination with switches of MOS field effect transistors to reduce the number of the logic gates for further reduction in time deal of the priority encoder in: accordance with the present invention.

FIG. 4 is a circuit diagram illustrative of one example of the encoder circuit available in the novel priority encoder, wherein the encoder circuit comprises logic gates. FIG. 5 is a circuit diagram illustrative of one example of the multiplexer circuit available in the novel priority encoder, wherein the multiplexer circuit comprises logic gates. FIG. 6 is a circuit diagram illustrative of other example of the encoder circuit available in the novel priority encoder, wherein the encoder circuit comprises logic gates in combination with switches of MOS field effect transistors to reduce the number of the logic gates for further reduction in time deal of the priority encoder. FIG. 7 is a circuit diagram illustrative of other example of the multiplexer circuit available in the novel priority encoder, wherein the multiplexer circuit comprises logic gates in combination with switches of MOS field effect transistors to reduce the number of the logic gates for further reduction in time deal of the priority encoder.

The conventional priority encoder may optionally comprise logic gates only. If a delay in time on each stage of the logic gates is "a", then a maximum total time delay Tpd' of the priority encoder is "a"×"w", where "w" is the number of words.

In accordance with the novel priority encoder, the increase in the number of the hierarchy by ont. results in an increase in time delay by the product of "a" and "n", wherein "n" is the number of stage of the logic gates for a single hierarchy. However, the umber of the stages through which the signals are transmitted is $\log_4(w)$, for which reason a maximum total time delay Tpd of the priority encoder is "a"×"w"×$\log_4(w)$.

When the conventional priority encoder comprises logic gates only, the logic gates having a plurality of input terminals may be selected to reduce the number of the stages to less than "w". Actually, however, the increase in the number of the input terminal of each logic gate is limited, for which reason it is difficult to reduce the number of the stages rather than the hierarchically structured priority encoder.

As the number of the words of the content addressable memory is increased for increasing the capacity, the above novel priority encoder reduces the total time delay remarkably. Since the above novel priority encoder has no signal feed-back structure, then this allows the priority encoder to exhibit high speed performance.

SECOND EMBODIMENT

A second embodiment according to the present invention will be described in detail with reference to FIG. 3 which is fragmentary block diagram illustrative of the second priority encoder improved in encoding more input signals than the novel priority encoder of FIG. 2. This second priority encoder is designed (i) encode 64 input signals and output 6-bits signals. This priority encoder has four sets of the novel priority encoder of FIG. 2. The four priority encoders of FIG. 2 are hierarchically structured or connected through additional provisions of extension encoder circuits not illustrated in FIG. 3 and extension multiplexers. For each of the four priority encoders of FIG. 2, (extension encoder circuits are provided for encoding uppermost 2-bits of the 4-bits address signals, whilst the extension multiplexers are provided for encoding the remaining 2-bits of the 4-bits address signals.

A pair of extension multiplexers 41 and 42 are connected to each of the priority encoder of FIG. 12. Each of the extension multiplexers 41 and 42 has the same circuit configuration as the intermediate level hierarchy multiplexers 20, 21 and 22. The first extension multiplexer 41 has a first input terminal A0 which is connected to the output terminal Y0 of the first intermediate level hierarchy multiplexer 22 for receiving one of the 2-bits multiplexed output signal from the first intermediate level hierarchy multiplexer 22. The first extension multiplexer 41 also has a second input terminal B0 which is connected to the output terminal IA0 of the first extension multiplexer on the previous stage for receiving one of the 2-bits multiplexed output signal from the first extension multiplexer on the previous stage not illustrated. The first extension multiplexer 41 has a third input terminal A1 which is connected to the output terminal Y1 of the first intermediate level hierarchy multiplexer 22 for receiving the remaining one of the 2-bits multiplexed output signal from the first intermediate level hierarchy multiplexer 22. The first extension multiplexer 41 also has a fourth input terminal B1 which is connected to the output terminal IA1 of the first extension multiplexer on the previous stage for receiving the remaining one of the 2-bits multiplexed output signal from the first extension multiplexer on the previous stage not illustrated. The first extension multiplexer 41 also has a control terminal C connected to the enable output terminal "EN" of the uppermost level hierarchy encoder circuit 3. If the control terminal C of the first extension multiplexer 41 receives the enabling signal of the high level "1", then the first extension multiplexer 41 is operated to output, onto the output terminals Y0 and Y1, the 2-bits encoded output signal transmitted from the output terminals of the first intermediate level hierarchy multiplexer 22 and received by the first and third input terminals A0 and A1. If the control terminal C of the first extension multiplexer 41 receives the enabling signal of the low level "0", then the first extension multiplexer 41 is operated to output, onto the output terminals Y0 and Y1, the 2-bits multiplexed output signal transmitted from the output terminals IA0 and IA1 of the first extension multiplexer on the previous stake and received by the second and fourth input terminals B0 and B1. The 2-bits output signals OA0 and OA1 on the output terminals Y0 and Y1 of the first extension multiplexer 41 are transmitted into the second and fourth output terminals of the first extension multiplexer on the next stage.

The second extension multiplexer 42 has a first input terminal A0 which is connected to the output terminal Y0 of the uppermost level hierarchy encoder circuit 3 for receiving one of the 2-bits multiplexed output signal from the uppermost level hierarchy encoder circuit 3. The second extension multiplexer 42 also has a second input terminal B0 which is connected to the output terminal IB0 of the second extension multiplexer on the previous stage for receiving one of the 2-bits multiplexed output signal from the second extension multiplexer on the previous stage not illustrated. The second extension multiplexer 42 has a third input terminal A1 which is connected to the output terminal Y1 of the uppermost level hierarchy encoder circuit 3 for receiving the remaining one of the 2-bits multiplexed output signal from the uppermost level hierarchy encoder circuit 3. The second extension multiplexer 42 also has a fourth input terminal B1 which is connected to the output terminal IB1 of the second extension multiplexer on the previous stage for receiving the remaining one of the 2-bits multiplexed output signal from the first extension multiplexer on the previous stage not illustrated. The second extension multiplexer 42 also has a control terminal C connected to the enable output terminal "EN" of the uppermost level hierarchy encoder circuit 3. If the control terminal C of the second extension multiplexer 42 receives the enabling signal of the high level "1", then the second extension multiplexer 42 is operated to output, onto the output terminals Y0 and Y1, the 2-bits encoded output signal transmitted from the output terminals of the uppermost level hierarchy encoder circuit 3 and received by the first and third input terminals A0 and A1. If the control terminal C of the second extension multiplexer 42 receives the enabling signal of the low level "0", then the second extension multiplexer 42 is operated to output, onto the output terminals Y0 and Y1, the 2-bits, multiplexed output signal transmitted from the output terminals IB0 and IB1 of the second extension multiplexer on the previous stage and received by the second and fourth input terminals B0 and B1. The 2-bits output signals OB0 and OB1 on the output terminals Y0 and Y1 of the second extension multiplexer 42 are transmitted into the second and fourth output terminals of the second extension multiplexer on the next stage.

The extension encoder circuit has the same circuit configuration as the lowermost level hierarchy encoder circuits and the uppermost level hierarchy encoder circuit. The extension encoder circuit is connected to the enabling signal terminal "EN" of the uppermost level hierarchy encoder circuit 3 for receiving the enabling signal from the uppermost level hierarchy encoder circuit 3.

The first extension multiplexer 41 has the lowermost level, whilst the second extension multiplexer 42 has the uppermost level. The first extension multiplexer 41 outputs the lowermost 2-bits of the 6-bits output signals of the priority encoder. The second extension multiplexer 42 outputs the intermediate 2-bits of the 6-bits output signals of the priority encoder The extension encoder circuit outputs the uppermost 2-bits of the 6-bits output signals of the priority encoder.

Figure 2:
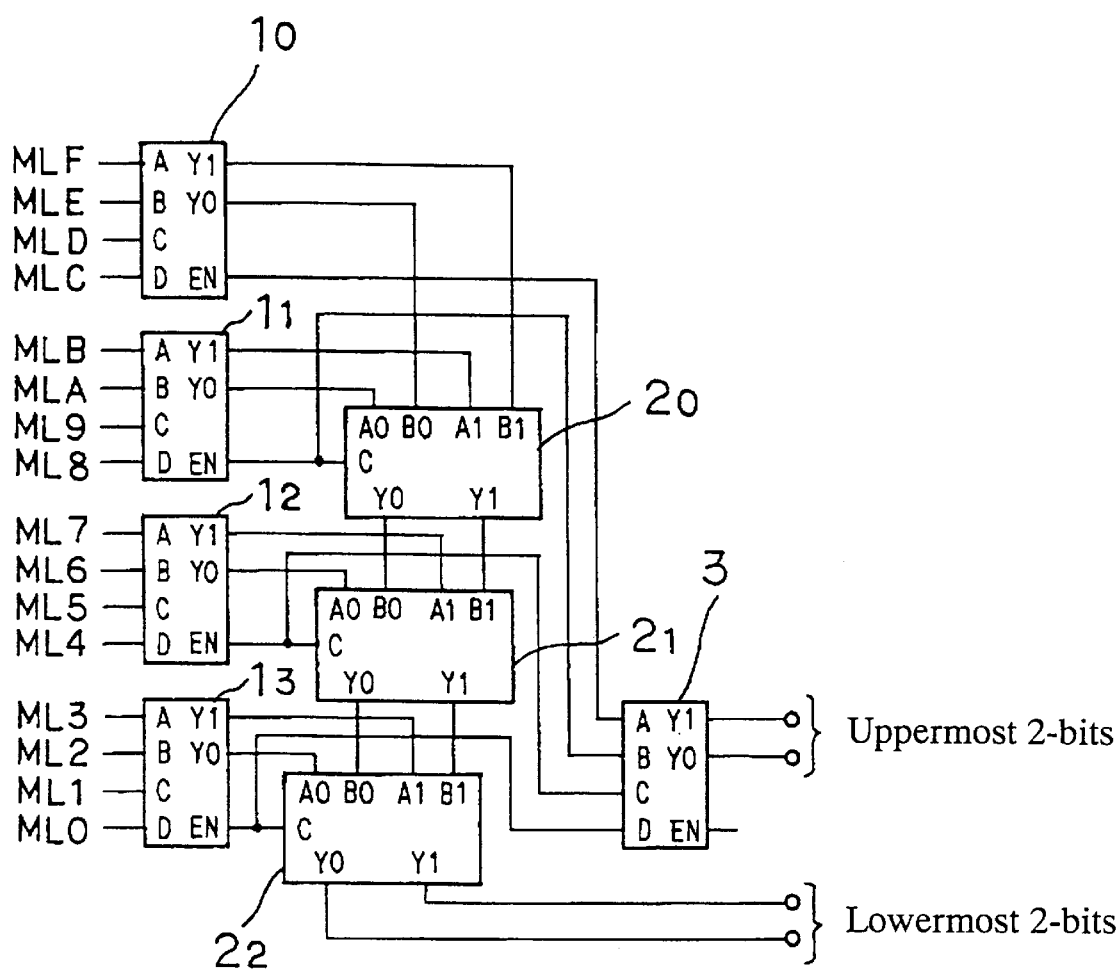
FIG. 2 is a block diagram illustrative of a first novel priority encoder in a first embodiment in accordance with the present invention.
Figure 3:
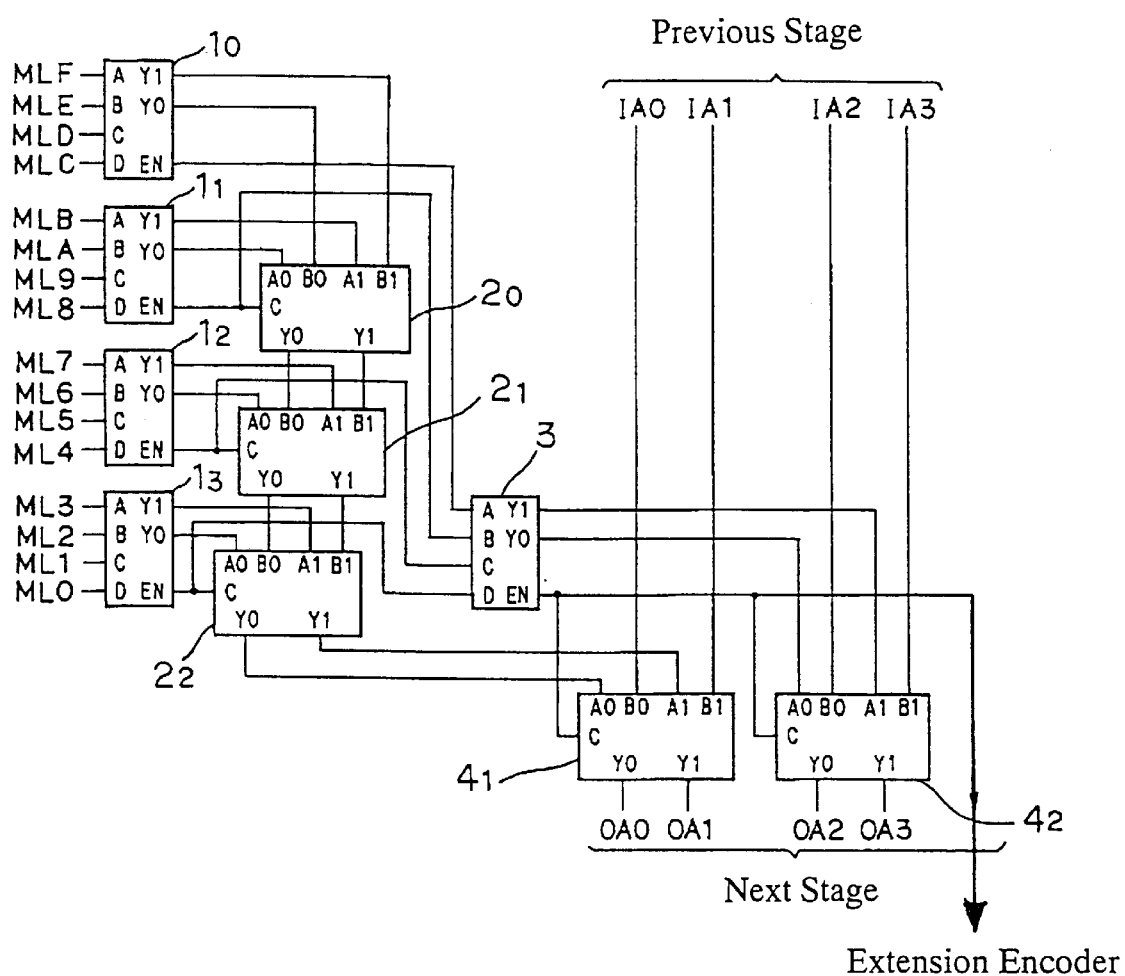
FIG. 3 is block diagram illustrative of another priority encoder improved in encoding more input signals than the novel priority encoder of FIG. 2, in a second embodiment in accordance with the present invention.

This second priority encoder may be modified to encode further more input signals than 64 input signals, wherein more than 4 sets of the priority encoder of FIG. 2 are provided along with a plurality of stages of an extension circuit having at least one extension encoder circuit and a plurality of extension multiplexers. If the number of the input signals to be inputted into the priority encoder is "m" and the number of the stages of the extension circuits is "n" as well as the number of the stage is n-k, then the number of the extension encoder circuits provided in the extension circuit on this stage is the "k" power of "m" and the number of the extension multiplexers provided therein is at least (n+1)(m−1).

FIG. 4 is a circuit diagram illustrative of one example of the encoder circuit available in the novel priority encoder, wherein the encoder circuit comprises logic gates. FIG. 5 is a circuit diagram illustrative of one example of the multiplexer circuit available in the novel priority encoder, wherein the multiplexer circuit comprises logic gates. FIG. 6 is a circuit diagram illustrative of other example of the encoder circuit available in the novel priority encoder, wherein the encoder circuit comprises logic gates in combination with switches of MOS field effect transistors to reduce the number of the logic gates for further reduction in time deal of the priority encoder. FIG. 7 is a circuit diagram illustrative of other example of the multiplexer circuit available in the novel priority encoder, wherein the multiplexer circuit comprises logic gates in combination with switches of MOS field effect transistors to reduce the number of the logic gates for further reduction in time deal of the priority encoder.

The conventional priority encoder may optionally comprise logic gates only. If a delay in time on each stage of the logic gates is "a", then a maximum total time delay Tpd' of the priority encoder is "a"×"w", where "w" is the number of words.

In accordance with the novel priority encoder, the increase in the number of the hierarchy by one results in an increase in time delay by the product of "a" and "n", wherein "n" is the number of stage of the logic gates for a single hierarchy. However, the umber of the stages through which the signals are transmitted is $\log_4(w)$, for which reason a maximum total time delay Tpd of the priority encoder is "a"×"w"×$\log_4(w)$.

When the conventional priority encoder comprises logic gates only, the logic gates having a plurality of input terminals may be selected to reduce the number of the stages to less than "w". Actuarially, however, the increase in the number of the input terminal of each logic gate is limited, for which reason it is difficult to reduce the number of the stages rather than the hierarchically structured priority encoder.

As the number of the words of the content addressable memory is increased for increasing the capacity, the above novel priority encoder reduces the total time delay remarkably. Since the above novel priority encoder has no signal feed-back structure, then this allows the priority encoder to exhibit high speed performance.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A priority encoder having at least a unit circuitry of at least three hierarchies which comprises:

a lowermost level hierarchy having a plurality of lowermost level encoder circuits receiving a plurality of input signals with individually different priorities for encoding said input signals and outputting encoded output signals, and said lowermost level encoder circuits outputting enable signals which indicate existence of signals to be coded into address signals in said input signals;

an intermediate level hierarchy having a plurality of multiplexer circuits connected to said lowermost level encoder circuits for receiving said encoded output signals and said enable signals so that said multiplexer circuits are configured to output only an encoded signal which has a highest priority in the encoded output signals to be coded into address signals; and an uppermost level hierarchy having at least an uppermost level encoder circuit receiving said enable signals from said lowermost level encoder circuits for encoding said enable signals to output encoded enable signals.

2. The priority encoder as claimed in claim 1, wherein said priority encoder has a single set of said unit circuitry, so that an uppermost one of said multiplexer circuits in said intermediate level hierarchy outputs a lowermost bit part of said output signals of said priority encoder and that said uppermost level encoder circuit in said uppermost level hierarchy outputs an uppermost bit part of said output signals of said priority encoder.

3. The priority encoder as claimed in claim 1, wherein said priority encoder has plural sets of said unit circuitry and a plurality of stages, each having an extension circuit which comprises:

at least a first extension multiplexer receiving both said encoded signal from said multiplexer circuits in said intermediate level hierarchy and output signals from a first extension multiplexer on a previous stage as well as receiving an enable signal from said uppermost level encoder circuit so that said at least first extension multiplexer outputs a lowermost bit part of said output signals of said priority encoder;

at least a second extension multiplexer receiving both said encoded enable signals from said uppermost level encoder circuit in said uppermost level hierarchy and output signals from a second extension multiplexer on said previous stage as well as receiving said enable signal from said uppermost level encoder circuit so that said at least second extension multiplexer outputs an intermediate bit part of said output signals of said priority encoder; and at least an extension encoder receiving said enable signal from said uppermost level encoder circuit so that said extension encoder outputs an uppermost bit part of said output signals of said priority encoder.

* * * * *

UNITED STATES PATENT AND TRADEMARK OFFICE
CERTIFICATE OF CORRECTION

PATENT NO. : 5,973,950
DATED : October 26, 1999
INVENTOR(S) : Takeshi SHINDO

It is certified that error appears in the above-indentified patent and that said Letters Patent is hereby corrected as shown below:

On the title page, insert Item [30] as follows:

--[30]   Foreign Application Priority Data

December 16, 1997      [JP]      Japan.......09-346444--.

Signed and Sealed this

Second Day of May, 2000

Attest:

Q. TODD DICKINSON

*Attesting Officer*      *Director of Patents and Trademarks*